(12) United States Patent
Eiles et al.

(10) Patent No.: US 6,570,247 B1
(45) Date of Patent: May 27, 2003

(54) INTEGRATED CIRCUIT DEVICE HAVING AN EMBEDDED HEAT SLUG

(75) Inventors: Travis M. Eiles, San Jose, CA (US); Mario J. Paniccia, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/001,704

(22) Filed: Dec. 30, 1997

(51) Int. Cl.[7] .................. H01L 23/10; H01L 23/34; H01L 23/28; H05K 7/20
(52) U.S. Cl. .............. 257/707; 257/706; 257/796; 361/707; 174/163; 165/80.2
(58) Field of Search .................. 257/707, 706, 257/796; 361/707, 709, 714, 717, 718; 174/16.3; 165/80.2

(56) References Cited

U.S. PATENT DOCUMENTS

| | | | |
|---|---|---|---|
| 4,203,129 A | 5/1980 | Oktay et al. ............ 357/82 |
| 4,224,734 A | 9/1980 | Tiefert et al. | |
| 4,582,954 A | 4/1986 | Eaton et al. ............ 174/16 |
| 4,630,172 A | * 12/1986 | Stenerson et al. ........ 361/386 |
| 4,649,992 A | 3/1987 | Geen et al. ............. 165/185 |
| 4,744,008 A | * 5/1988 | Black et al. ............ 361/386 |
| 5,045,503 A | 9/1991 | Kobiki et al. | |
| 5,070,040 A | 12/1991 | Pankove .............. 437/209 |
| 5,105,259 A | 4/1992 | McShane et al. | |
| 5,146,314 A | 9/1992 | Pankove .............. 357/82 |
| 5,172,213 A | 12/1992 | Zimmerman | |
| 5,291,064 A | 3/1994 | Kurokawa ............ 257/714 |
| 5,319,237 A | * 6/1994 | Legros ............... 257/712 |
| 5,354,717 A | 10/1994 | Pollock et al. ......... 437/225 |
| 5,376,587 A | 12/1994 | Buchmann et al. ...... 437/209 |
| 5,397,917 A | * 3/1995 | Ommen et al. ......... 257/698 |
| 5,434,094 A | 7/1995 | Kobiki et al. | |
| 5,451,551 A | 9/1995 | Krishnan et al. | |
| 5,500,540 A | 3/1996 | Jewell et al. .......... 257/82 |
| 5,508,230 A | 4/1996 | Anderson et al. ....... 437/183 |
| 5,543,657 A | 8/1996 | Diffender et al. | |
| 5,610,442 A | 3/1997 | Schneider et al. ...... 257/787 |
| 5,616,957 A | 4/1997 | Kajihara | |
| 5,644,163 A | 7/1997 | Tsuji ................. 257/706 |
| 5,666,003 A | * 9/1997 | Shibata et al. ......... 257/796 |
| 5,753,529 A | 5/1998 | Chang et al. | |
| 5,761,044 A | * 6/1998 | Nakajima ............. 257/722 |
| 5,777,380 A | * 7/1998 | Otsuki et al. .......... 257/675 |
| 5,812,376 A | * 9/1998 | Mach et al. ........... 361/719 |
| 5,814,149 A | 9/1998 | Shintani et al. | |
| 5,859,477 A | * 1/1999 | Fehr ................. 257/796 |
| 5,883,430 A | * 3/1999 | Johnson .............. 257/706 |
| 5,895,972 A | * 4/1999 | Paniccia ............. 257/706 |
| 5,907,189 A | 5/1999 | Mertol | |
| 5,986,885 A | 11/1999 | Wyland | |
| 6,035,527 A | 3/2000 | Tamm | |
| 6,127,724 A | 10/2000 | DiStefano | |

FOREIGN PATENT DOCUMENTS

| | | | | |
|---|---|---|---|---|
| EP | 0297894 A2 | 4/1989 | | |
| JP | 62-93963 | * 4/1987 | ........... 257/796 |
| JP | 62-117351 | * 5/1987 | ........... 257/796 |
| JP | 63-81956 | 4/1988 | | |
| JP | 2-276264 A | 11/1990 | | |

* cited by examiner

*Primary Examiner*—Jasmine J B Clark
(74) *Attorney, Agent, or Firm*—Blakely, Sokoloff, Taylor & Zafman LLP

(57) ABSTRACT

An integrated circuit device having an embedded heat slug. The integrated circuit device comprises, in one embodiment, a semiconductor substrate having a frontside surface and backside surface. The semiconductor substrate includes an integrated circuit on the frontside surface. A heat slug is disposed in an opening in the backside surface of the semiconductor substrate adjacent the integrated circuit.

39 Claims, 4 Drawing Sheets

INTEGRATED CIRCUIT DEVICE HAVING AN EMBEDDED HEAT SLUG

FIELD OF THE INVENTION

The present invention relates to the cooling of a semiconductor device, and more particularly, to a semiconductor device having an embedded heatsink.

BACKGROUND OF THE INVENTION

Within the integrated circuit industry there is a continuing effort to increase integrated circuit speed as well as device density. As a result of these efforts, there is a trend towards using flip chip technology when packaging complex high speed integrated circuits. Flip chip technology is also known as controlled collapse chip connection (C4) technology. In C4 technology, the integrated circuit die is flipped upside down. This is opposite to how integrated circuits are generally packaged today using wire bond technology. By flipping the integrated circuit die upside down, ball bonds may be used to provide direct electrical connections from the bond pads of the die directly to a corresponding set of pads on a package.

In the following discussion reference will be made to a number of drawings. The drawings are provided for descriptive purposes only and are not drawn to scale.

FIG. 1A illustrates a C4 mounted integrated circuit die 102 that is electrically coupled to a package substrate 120 by ball bonds 116. Die 102 includes a semiconductor substrate 104 that has a frontside surface 114 and a backside surface 112. The active regions 106 and 108 of the integrated circuit are formed from the frontside surface 114 of the of the semiconductor substrate 104. Because the bond pads of integrated circuit device 102 are located adjacent the frontside surface 114 of the device, the die must be flipped upside down so that it may be attached to package substrate 120.

With microprocessor core frequencies climbing into the gigahertz range, one of the major concerns in microprocessor performance is thermal management. There are well known reliability and performance concerns with very high power parts, as the junction temperature must be maintained below certain temperature limits to ensure long life of the part and also to achieve reasonable transistor performance. Specifically, there is a need to address localized cooling of very high power circuit areas on the chip.

FIG. 1B illustrates a prior art approach to dissipating heat from a C4 mounted integrated circuit device. Heat is removed from the backside surface 112 of device 102 by passing an air flow 140 over a finned heatsink 130 that is thermally coupled to the backside surface 112. In some instances, heat is dissipated from device 102 by attaching a thermally conductive heat slug to backside surface 112 and thermally coupling the heat slug to a heatsink. In other instances, the heat slug may be thermally coupled to a heat spreading plate by a heat pipe or some other low resistance path.

The semiconductor substrate 104 is typically made of silicon, or other types of semiconductor materials. These materials are capable of conducting a certain amount of heat which permits heat to be conducted from the transistor level where it is generated, through the semiconductor substrate 104, and then into the heatsink 130. However, due to non-uniform heat dissipation between different regions of the integrated circuit, there can still be local "hot spots" on the die in which the junction temperatures in one region of the die can be higher than in other regions of die. Local hot spots can lead to reduced long-term reliability of the integrated circuit, as degradation mechanisms such as electromigration are increased at elevated temperatures. Furthermore, the speed performance of the integrated circuit is reduced at higher temperatures due to decreased electron mobility in the transistors.

What is needed is a method and an apparatus for removing heat from an integrated circuit in a manner that minimizes temperature gradients across the integrated circuit.

BRIEF DESCRIPTION OF THE DRAWINGS

The present invention is illustrated by way of example and is not limited by the figures of the accompanying drawings, in which like references indicate similar elements, and in which.

DETAILED DESCRIPTION

An apparatus and method for removing heat from an integrated circuit is described. In the following description, numerous specific details are set forth such as material types, dimensions, processing steps, etc., in order to provide a thorough understanding of the present invention. However, the invention may be practiced without these specific details. In other instances, well known elements and processing techniques have not been shown in particular detail in order to avoid unnecessarily obscuring the description of the present invention. This discussion will mainly be limited to those needs associated with removing heat from flip chips. It will be recognized, however, that such focus is for descriptive purposes only and that the apparatus and methods of the present invention are applicable to other electronic devices.

Figure 1A:
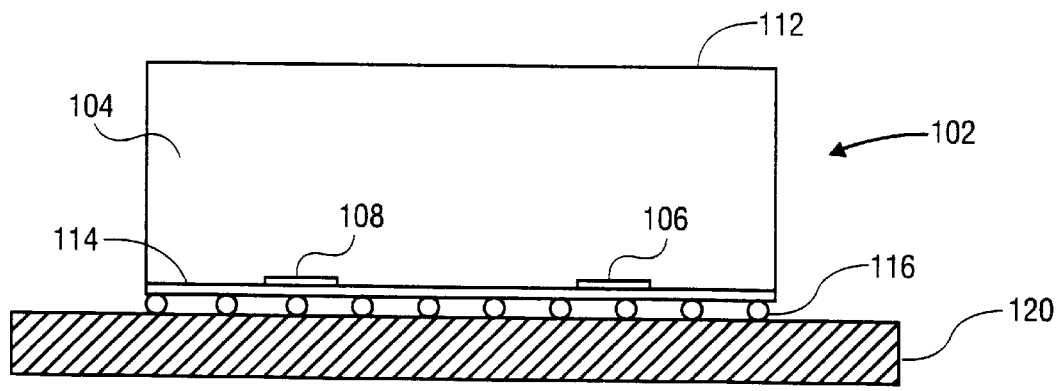
FIG. 1A illustrates a integrated circuit device that is mounted to a package using flip chip/C4 packaging technology.
Figure 1B:
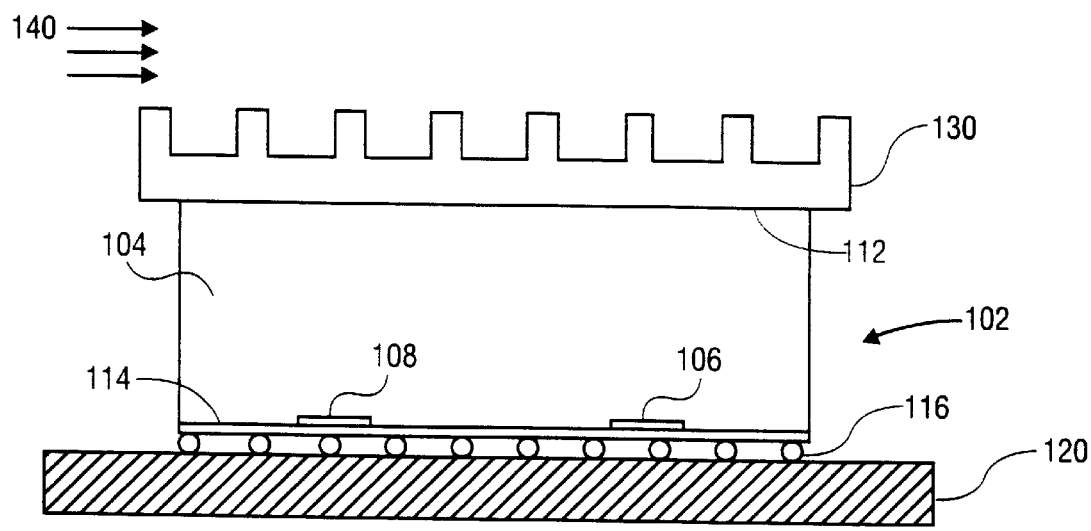
FIG. 1B illustrates the integrated circuit device of FIG. 1A having a finned heatsink attached to the backside of the semiconductor substrate.
Figure 2:
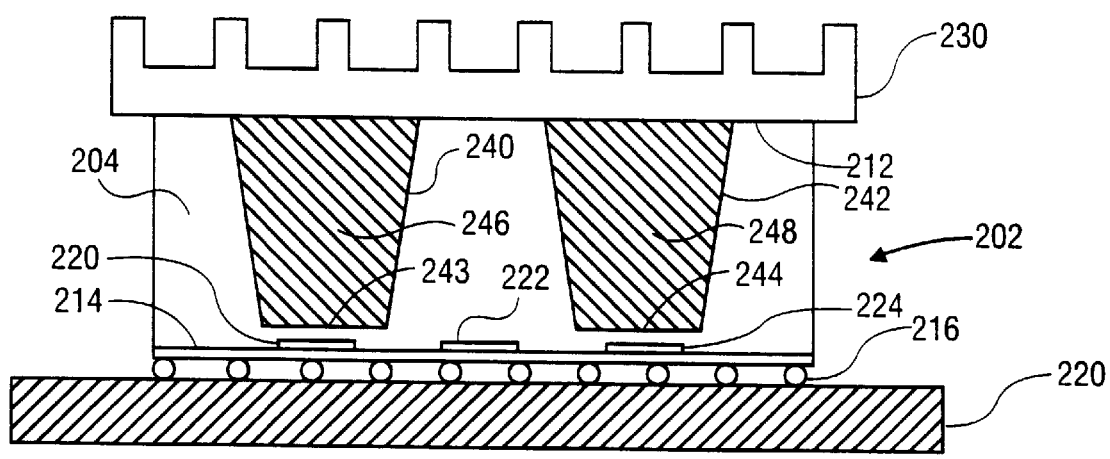
FIG. 2 is an integrated circuit device having an embedded heat slug.

FIG. 2 illustrates a side view of an integrated circuit device 202 that is electrically coupled to a package substrate 220 by ball bonds 216. Integrated circuit device 202 includes a semiconductor substrate 204 that has a frontside surface 214 and a backside surface 212. The active regions 220, 222, and 224 of the integrated circuit are formed from the frontside surface 214 of the of the semiconductor substrate 204. Active regions 220 and 224 represent high power density regions of the integrated circuit while region 222 represents a lower power density region. Embedded heat slugs 246 and 248 are provided within the semiconductor substrate 204 adjacent the high power density regions 220 and 224. Heat slugs 246 and 248 are made of a material having a higher thermal conductivity than that of the semiconductor substrate 204.

Typically, a heatsink 230 that is thermally coupled to heat slugs 246 and 248 is attached to the backside surface 212 of device 202. In FIG. 2, a finned heatsink is shown attached to the backside surface 212 of integrated circuit device 202.

It is appreciated, however, that other forms of cooling devices may be used to draw heat away from heat slugs 246 and 248. For instance, a heat pipe or other low resistance thermal path may be used to thermally couple heat slugs 246 and 248 to a heat spreading plate or other heatsink that is located external to the packaged device.

In one embodiment, heat slugs 246 and 248 are made of diamond. The diamond is deposited within recesses 240 and 242 in the semiconductor substrate by a chemical-vapor deposition process. Since some crystal forms of diamond have thermal conductivities approximately twelve times larger than that of silicon, diamond provides an excellent means for pulling heat away from the high power density regions of the integrated circuit and out to the backside surface 212 of device 202. Note, however, that the type of heat slug material used may vary depending upon the particular heat removal requirements.

The placement of heat slugs 246 and 248 in close proximity to the high power density regions 220 and 224 reduces the thermal gradients that would otherwise be induced by these regions.

Figure 3:
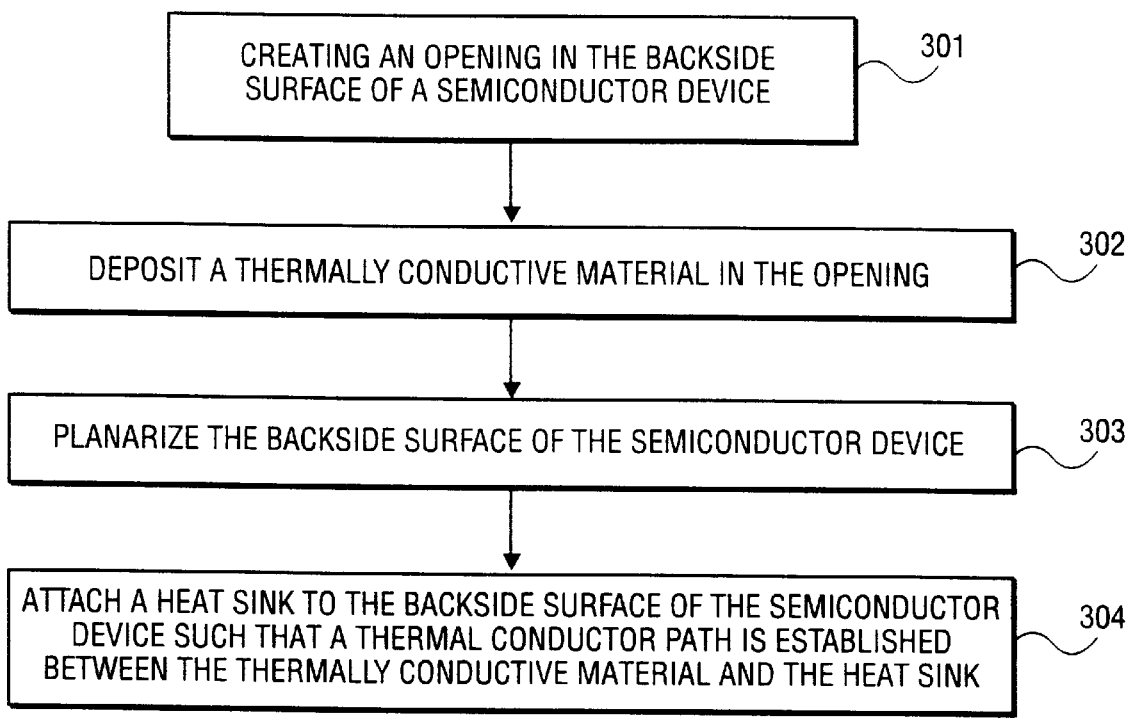
FIG. 3 is a flow chart of a method for creating an embedded heat slug in an integrated circuit device.

FIG. 3 is a flow chart of a process for creating the embedded heat slugs 246 and 248. In step 301, openings 240 and 242 are created within the backside surface 212 of semiconductor substrate 204. The semiconductor substrate 204 may be chemically etched or micromachined to form the openings. This step may be performed on the wafer, die, or package level. It is preferable to thin the semiconductor substrate so that the floors 243 and 244 of the openings are in close proximity to the high power density regions 220 and 224 of the integrated circuit. In one embodiment the silicon semiconductor substrate 204 is locally etched to within 50 to 100 microns of regions 220 and 224. The localized manner in which openings 240 and 242 are produces permits the floor area of the openings to be relatively large without significantly affecting the overall mechanical strength of the integrated circuit device. For example, in one embodiment the floor area of openings 240 and 242 is approximately 1 millimeter by 1 millimeter.

In step 302, a thermally conductive material is deposited in openings 240 and 242. In one embodiment, diamond is deposited within openings 240 and 242 in a low temperature chemical-vapor deposition process. The deposition step may be performed early in the wafer fabrication process. The low temperature chemical vapor deposition process also permits the diamond deposition to be performed later at the die or package level. Other thermally conductive materials, such as copper, aluminum, gold, silver, etc., may be deposited into openings 240 and 242 using standard evaporation, sputtering or electroplating processes.

In step 303, the deposited material is planarized to produce a flat surface along the backside of the semiconductor substrate 204. Planarization is generally achieved by mechanical grinding the backside surface 212 of substrate 204.

In step 304, a heatsink is attached to the backside surface 212 of semiconductor substrate 204. The heatsink is typically mounted to the backside surface 212 through a highly conductive thermal compound such as a thermal grease or thermal adhesive.

In order to test and debug C4 mounted integrated circuit devices a number of optical-based testing methods, such as laser probing, have been developed that permit probing of internal portions of an integrated circuit through the backside of the C4 mounted devices. Since the active regions of the integrated circuit are located near the backside surface of the device, it is easier to access these regions for the purposes of laser probing. Note also that the metal interconnects in the first metal layer of the integrated circuit generally carry the most valuable electrical data for debugging purposes. Metal interconnect lines in the first metal layer reside closest to the semiconductor substrate and are usually directly coupled to important components of the integrated circuit device such as transistors, resistors and capacitors. It is the electrical data received, manipulated, and transmitted by these components that a designer is most interested in analyzing during the debugging process. As such, the testing of first layer metal interconnects may be simplified with the use of an optical-based backside testing method.

Another advantage of the present invention is that it permits the designer to strategically place embedded infrared transparent heat slugs at locations that will likely require optical probing during debug or testing. Infra-red transparent materials such as diamond may be deposited into openings 240 and 242 to produce the heat slugs.

Figure 4:
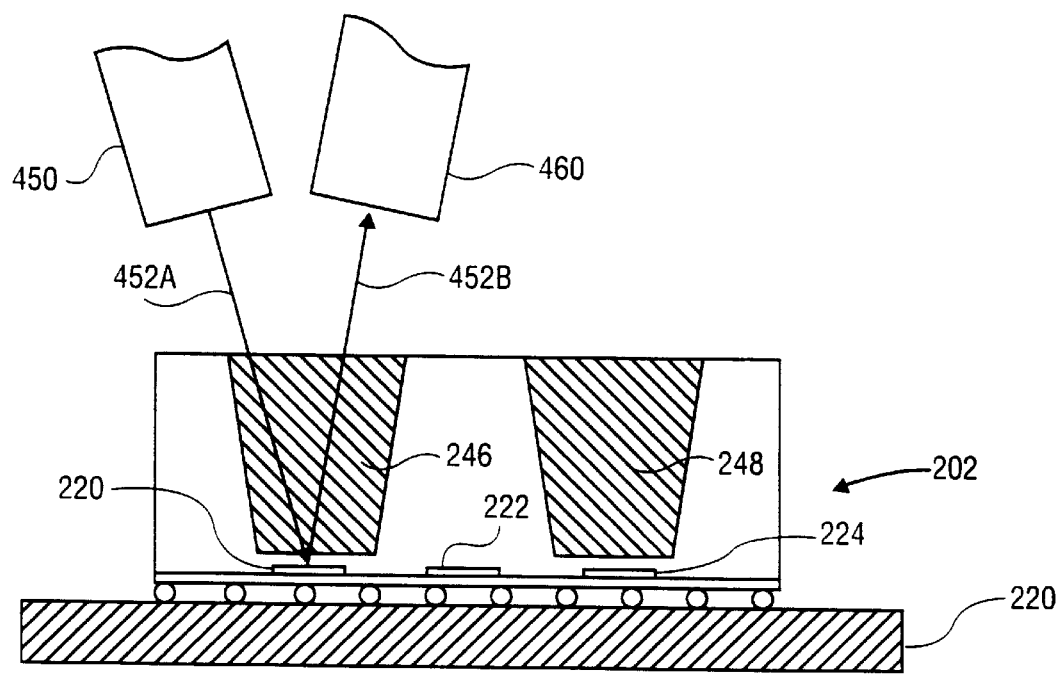
FIG. 4 shows the integrated circuit device of FIG. 2 being tested using a laser probe.

Turning now to FIG. 4, the integrated circuit device 202 of FIG. 2 is shown being probed by a laser beam 452. Probing of integrated circuit 202 is achieved by positioning a laser 450 above integrated circuit device 202 and directing a laser beam 452a through heat slug 246 and onto a P-N junction, metal interconnect, etc., located within region 220 of the Integrated circuit. A reflected laser beam 452b is produced as laser beam 452a is reflected from a metal contact or metal layer in the circuit. A detector 460 measures reflected laser beam 452b. The phase shift between laser beam 452a and 452b is measured to determine the voltage at the P-N junction. It is appreciated that the laser probing apparatus of FIG. 4 is only exemplary of one of many optical probing configurations that may be used to test the integrated circuit.

Thus, what has been described is an apparatus and method for removing heat from an integrated circuit. In the foregoing detailed description, the methods and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. An integrated circuit device comprising:
   a semiconductor substrate having a frontside surface and a backside surface, said substrate defining a recess in said backside surface;
   an integrated circuit on said frontside surface including a first region and a second region, said first region being an active region of high power density and said second region being an active region of low power density; and
   a heat slug embedded in said backside surface of said semiconductor substrate to fill said recess adjacent to said first region.

2. The integrated circuit device of claim 1 wherein said heat slug is made of a material having a thermal conductivity greater than the thermal conductivity of said semiconductor substrate.

3. The integrated circuit device of claim 1 wherein said heat slug includes diamond.

4. The integrated circuit device of claim 1 further comprising a heatsink attached to said backside surface of said semiconductor substrate, said heat slug being thermally coupled to said heatsink.

5. The integrated circuit device of claim 4 wherein said heatsink includes a heat pipe.

6. The integrated circuit device of claim 1 wherein said device is a C4-mounted integrated circuit device.

7. An integrated circuit device comprising:
a semiconductor substrate having a frontside surface and a backside surface, said substrate defining a recess in said backside surface;
an integrated circuit on said frontside surface including a first region and a second region, said first region being an active region of high power density and said second region being an active region of low power density;
a heat slug embedded in said backside surface of said semiconductor substrate to fill said recess adjacent to said first region of said integrated circuit; and
a heatsink attached to said backside surface of said semiconductor substrate, said heat slug thermally coupled to said heatsink.

8. The integrated circuit device of claim 7 wherein said heat slug is made of a material having a thermal conductivity greater than the thermal conductivity of said semiconductor substrate.

9. The integrated circuit device of claim 7 wherein said heat slug includes diamond.

10. The integrated circuit device of claim 7 wherein said device is a C4 mounted integrated circuit device.

11. An integrated circuit device comprising:
semiconductor substrate having an integrated circuit formed therein, wherein said semiconductor substrate has a backside surface and a frontside surface, said substrate defining a recess in said backside surface;
a heat slug disposed in said semiconductor substrate to fill said recess; and
a heat pipe thermally coupled to said heat slug.

12. The integrated circuit device of claim 11 wherein said heat slug is disposed in said backside surface of said semiconductor substrate to fill said recess.

13. The integrated circuit device of claim 12 wherein said integrated circuit is on said frontside surface, said integrated circuit including a first region and a second region, said first region being an active region of high power density and said second region being an active region of low power density, and said heat slug is adjacent to said first region.

14. The integrated circuit device of claim 12 wherein said device is a C4 mounted integrated circuit device.

15. An integrated circuit device comprising:
an integrated circuit including a first region and a second region, said first region being an active region of high power density and said second region being an active region of low power density;
a semiconductor substrate having the integrated circuit formed therein, said substrate defining a recess; and
a thermally conductive heat slug embedded in said semiconductor substrate to fill said recess, said heat slug being adjacent to said first region.

16. The integrated circuit device of claim 15 wherein said heat slug included diamond.

17. The integrated circuit device of claim 15 wherein semiconductor substrate has a backside surface and a frontside surface, and said recess is defined in said backside surface.

18. The integrated circuit device of claim 17 wherein said heat slug deposited in said recess by a chemical-vapor deposition.

19. An integrated circuit device comprising:
an integrated circuit including a first region and a second region, said first region being an active region of high power density and said second region being an active region of low power density;
a semiconductor substrate having an integrated circuit formed therein, said substrate defining a recess; and
a heat slug comprised of a thermally conductive material embedded in said semiconductor substrate to fill said recess, said heat slug being adjacent to said first region.

20. The integrated circuit device in claim 19 wherein said thermally conductive material includes copper.

21. The integrated circuit device in claim 19 wherein said thermally conductive material includes aluminum.

22. The integrated circuit device in claim 19 wherein said thermally conductive material includes gold.

23. The integrated circuit device in claim 19 wherein said thermally conductive material includes silver.

24. The integrated circuit device in claim 37 wherein said metal deposition process is standard evaporation.

25. The integrated circuit device in claim 37 wherein said metal deposition process is sputtering.

26. The integrated circuit device in claim 37 wherein said metal deposition process is electroplating.

27. An integrated circuit device comprising:
a semiconductor substrate having a frontside surface and a backside surface;
an integrated circuit on said frontside surface including a first region and a second region, said first region being an active region of high power density and said second region being an active region of low power density;
a heat slug disposed in an opening in said backside surface of said semiconductor substrate adjacent said first region of said integrated circuit, wherein said heat slug is embedded in said opening to fill said opening; and
a heatsink attached to said backside surface of said semiconductor substrate, said heat slug thermally coupled to said heatsink.

28. The integrated circuit device of claim 27 wherein said heatsink is a heat pipe.

29. The integrated circuit device of claim 12 wherein said heat slug is made of a material having a thermal conductivity greater than the thermal conductivity of said substrate.

30. The integrated circuit device of claim 12 wherein said device is a C4 mounted integrated circuit device.

31. The integrated circuit device of claim 12 wherein said heat slug includes diamond.

32. The integrated circuit device of claim 12 wherein said heat slug includes aluminum.

33. The integrated circuit device of claim 12 wherein said heat slug includes copper.

34. The integrated circuit device of claim 27 wherein said heat slug is made of a material having a thermal conductivity greater than the thermal conductivity of said semiconductor substrate.

35. The integrated circuit device of claim 27 wherein said heat slug includes diamond.

36. The integrated circuit device of claim 27 wherein said device is a C4 mounted integrated circuit device.

37. The integrated circuit device of claim 19 wherein said heat slug deposited in said recess by a metal deposition process.

38. The integrated circuit device of claim 1 wherein said heat slug includes aluminum.

39. The integrated circuit device of claim 1 wherein said heat slug includes copper.

* * * * *